US007002808B2

(12) United States Patent
Lim et al.

(10) Patent No.: US 7,002,808 B2
(45) Date of Patent: Feb. 21, 2006

(54) ASSEMBLING STRUCTURE OF ELECTRONIC APPARATUS AND ASSEMBLING METHOD THEREOF

(75) Inventors: Choo Soo Lim, Samutprakam (TH); Phumchai Chaisri, Samutprakam (TH)

(73) Assignees: Delta Electronics, Inc., Taoyuan Hsien (TW); Delta Electronics (Thailand) Public Company, Limited, Samutprakarn (TH)

( * ) Notice: Subject to any disclaimer, the term of this patent is extended or adjusted under 35 U.S.C. 154(b) by 0 days.

(21) Appl. No.: 11/119,549

(22) Filed: May 2, 2005

(65) Prior Publication Data

US 2005/0276026 A1 Dec. 15, 2005

(30) Foreign Application Priority Data

Jun. 10, 2004 (TW) .............................. 93116703 A

(51) Int. Cl.
*H05K 7/02* (2006.01)
*H01R 12/00* (2006.01)
*H02J 4/00* (2006.01)

(52) U.S. Cl. ...................... 361/752; 361/728; 361/807; 439/76.1; 439/131; 320/111; 29/830; 29/832

(58) Field of Classification Search ................ 361/752, 361/728, 819; 439/76.1, 131; 320/111; 257/678; 174/50, 52.1
See application file for complete search history.

(56) References Cited

U.S. PATENT DOCUMENTS 5,160,879 A * 11/1992 Tortola et al. .............. 320/111
5,170,322 A * 12/1992 von Guttenberg ........... 361/704
5,494,449 A * 2/1996 Chioo ....................... 439/76.1
5,579,211 A * 11/1996 Hendel ....................... 361/819
5,901,044 A * 5/1999 Marro ........................ 361/728
6,042,400 A * 3/2000 Queffelec et al. ........... 439/131
6,162,067 A * 12/2000 Haga ......................... 439/76.1
6,312,271 B1 * 11/2001 Tseng ......................... 439/131
6,604,951 B1 * 8/2003 Liao .......................... 439/76.1
6,644,984 B1 * 11/2003 Vista et al. ................ 439/76.1
6,851,955 B1 * 2/2005 Chen .......................... 439/76.1
2003/0219997 A1 * 11/2003 Ekkul et al. ............... 439/76.1
2004/0075989 A1 * 4/2004 Wong ......................... 361/752

* cited by examiner

*Primary Examiner*—Kamand Cuneo
*Assistant Examiner*—Dameon E. Levi
(74) *Attorney, Agent, or Firm*—Madson & Metcalf

(57) ABSTRACT

An assembling structure of an electronic apparatus and the assembling method thereof are disclosed. The assembling structure of an electronic apparatus comprises a casing having a receiving space, a plurality of conductive terminals, a printed circuit board and at least an electronic element. The plurality of conductive terminals are disposed on the casing, and each conductive terminal has a first part extending to the outer side of the casing and a second part extending to the inner side of the casing, wherein the second part has a through hole. The printed circuit board is disposed in the receiving space and has at least a conductive element and a plurality of conductive pads, wherein the plurality of conductive pads contact the second parts of the plurality of conductive terminals. The electronic element has a first linking bar and a second linking bar, wherein the first linking bar passes through the through hole, and the second linking bar connects with the conductive element of the printed circuit board.

16 Claims, 4 Drawing Sheets

ASSEMBLING STRUCTURE OF ELECTRONIC APPARATUS AND ASSEMBLING METHOD THEREOF

FIELD OF THE INVENTION

The present invention relates to an assembling structure of an electronic apparatus and the assembling method thereof, and more particularly to an assembling structure of an adaptor and the assembling method thereof.

BACKGROUND OF THE INVENTION

With the progress of science and technology day by day, various electronic apparatuses such as adaptors have been broadly used in the daily life. Because the design of the electronic apparatus heads toward the development trend of high power and miniaturization, the disposition and assembling method of the electronic elements in the electronic apparatus become an important consideration to solve the miniaturization and electromagnetic compatibility (EMC) problems.

Please refer to FIG. 1, which is a schematic view showing the assembling structure of a conventional electronic apparatus. As shown in FIG. 1, the conventional electronic apparatus comprises a casing 11, a plurality of conductive terminals 12, a printed circuit board 13, a connecting wire 14, and a conductive pad 15. The casing 11 comprises a first isolation casing 111 and a second isolation casing 112. The plurality of conductive terminals 12 are disposed on the first isolation casing 111 to be connected to the external power. The printed circuit board 13 is disposed inside the casing 11 and provides different power conversion functions via different circuit layouts and different dispositions of the electronic elements. The connecting wire 14 is connected between the conductive terminal 12 and the conductive pad 15 of the printed circuit board 13, so that the external power can be conducted to the printed circuit board 13 through the conductive terminal 12 and the connecting wire 14 to enable the electronic apparatus to perform its functions.

The assembling method of the aforesaid electronic apparatus is briefly described as follows. First, a casing 11 including a first isolation casing 111 and a second isolation casing 112 is provided, wherein a plurality of conductive terminals 12 are disposed on the first isolation casing 111. Next, a printed circuit board 13 is provided, wherein plural electronic elements (not shown) and conductive pads 15 are disposed on the printed circuit board 13. Then, the two ends of the connecting wire 14 are respectively connected to the conductive terminal 12 and the conductive pad 15 of the printed circuit board 13 by welding processes. Finally, the printed circuit board 13 is disposed inside the casing 11, and the first isolation casing 111 and the second isolation casing 112 are jointed together by an ultrasonic welding process to complete the assembling of the electronic apparatus.

Because the conventional electronic apparatus uses the connecting wire 14 to connect the conductive terminal 12 and the printed circuit board 13, the connecting wire 14 must possess a certain length for enabling the two ends thereof to be welded on the printed circuit board 13 and the conductive terminal 12; accordingly, the surplus connecting wire 14 will occupy a certain space inside the casing 11, which limits the miniaturization of the electronic apparatus. Besides, the surplus connecting wire 14, which is curly disposed inside the electronic apparatus, is easy to contact and compress the electronic elements on the printed circuit board 13; due to the compression, the electronic elements might malfunction, or the isolation layer of the connecting wire 14 might be broken, and then a short circuit might be resulted. Moreover, the aforesaid welding process is not easy to perform, so a bad welding is likely to happen. Furthermore, in the process of point welding, the heat will be conducted through the conductive terminal 12 to the first isolation casing 111, which might damage the first isolation casing 111, or influence the adhering intensity of the conductive terminal 12.

In addition, for the reason that the electronic elements of the printed circuit board 13 are connected and fixed by the surface mount technology (SMT), which needs a certain welding area provided on the printed circuit board 13, the printed circuit board 13 cannot be miniaturized, and the limited wiring space will become denser and more complex, which indirectly affects the electromagnetic compatibility (EMC) of the electronic apparatus.

SUMMARY OF THE INVENTION

An object of the present invention is to provide an assembling structure of an electronic apparatus and the assembling method thereof to facilitate the uses of the inner space of the electronic apparatus and the wiring area of the printed circuit board, so as to miniaturize the electronic apparatus.

Another object of the present invention is to provide an assembling structure of an electronic apparatus and the assembling method thereof to facilitate the assembling of the electronic apparatus and improve EMC.

In accordance with a first aspect of the present invention, the assembling structure of an electronic apparatus comprises a casing having a receiving space, a plurality of conductive terminals, a printed circuit board and at least an electronic element. The plurality of conductive terminals are disposed on the casing, and each conductive terminal has a first part extending to the outer side of the casing and a second part extending to the inner side of the casing, wherein the second part has a through hole. The printed circuit board is disposed in the receiving space and has at least a conductive element and a plurality of conductive pads, wherein the plurality of conductive pads contact the second parts of the plurality of conductive terminals. The electronic element has a first linking bar and a second linking bar, wherein the first linking bar passes through the through hole, and the second linking bar connects with the conductive element of the printed circuit board.

In an embodiment, the electronic element is a resistor, a capacitor, or a diode.

In an embodiment, the casing comprises a first isolation casing and a second isolation casing, which are assembled by an ultrasonic welding process.

In an embodiment, the first isolation casing further comprises a plurality of support elements in the inner side thereof to support and position the electronic element.

In an embodiment, the first isolation casing has a plurality of openings for disposing the plurality of conductive terminals.

In an embodiment, the conductive element is a via hole.

In an embodiment, the second linking bar inserts into the via hole of the printed circuit board, and a part of the second linking bar extends out of the printed circuit board. Besides, the second linking bar is fixed on the printed circuit board by a solder paste.

In an embodiment, the electronic apparatus is an adaptor.

In accordance with a second aspect of the present invention, the assembling method of an electronic apparatus comprises steps of: providing a first isolation casing having a plurality of conductive terminals disposed thereon, each conductive terminal having a first part extending to the outer side of the casing and a second part extending to the inner side of the casing, wherein the second part has a through hole; providing at least an electronic element having a first linking bar and a second linking bar; passing the first linking bar of the electronic element through the through hole; providing a printed circuit board having at least a via hole and a plurality of conductive pads; disposing the printed circuit board in the first isolation casing and inserting the second linking bar of the electronic elements into the via hole; fixing the second linking bar to the printed circuit board; and providing a second isolation casing and assembling the first isolation casing and the second isolation casing.

In an embodiment, the electronic element is a resistor, a capacitor, or a diode.

In an embodiment, the first isolation casing and the second isolation casing are assembled by an ultrasonic welding process.

In an embodiment, a part of the second linking bar extends out of the printed circuit board. Besides, the second linking bar is fixed on the printed circuit board by a solder paste.

In an embodiment, the electronic apparatus is an adaptor.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
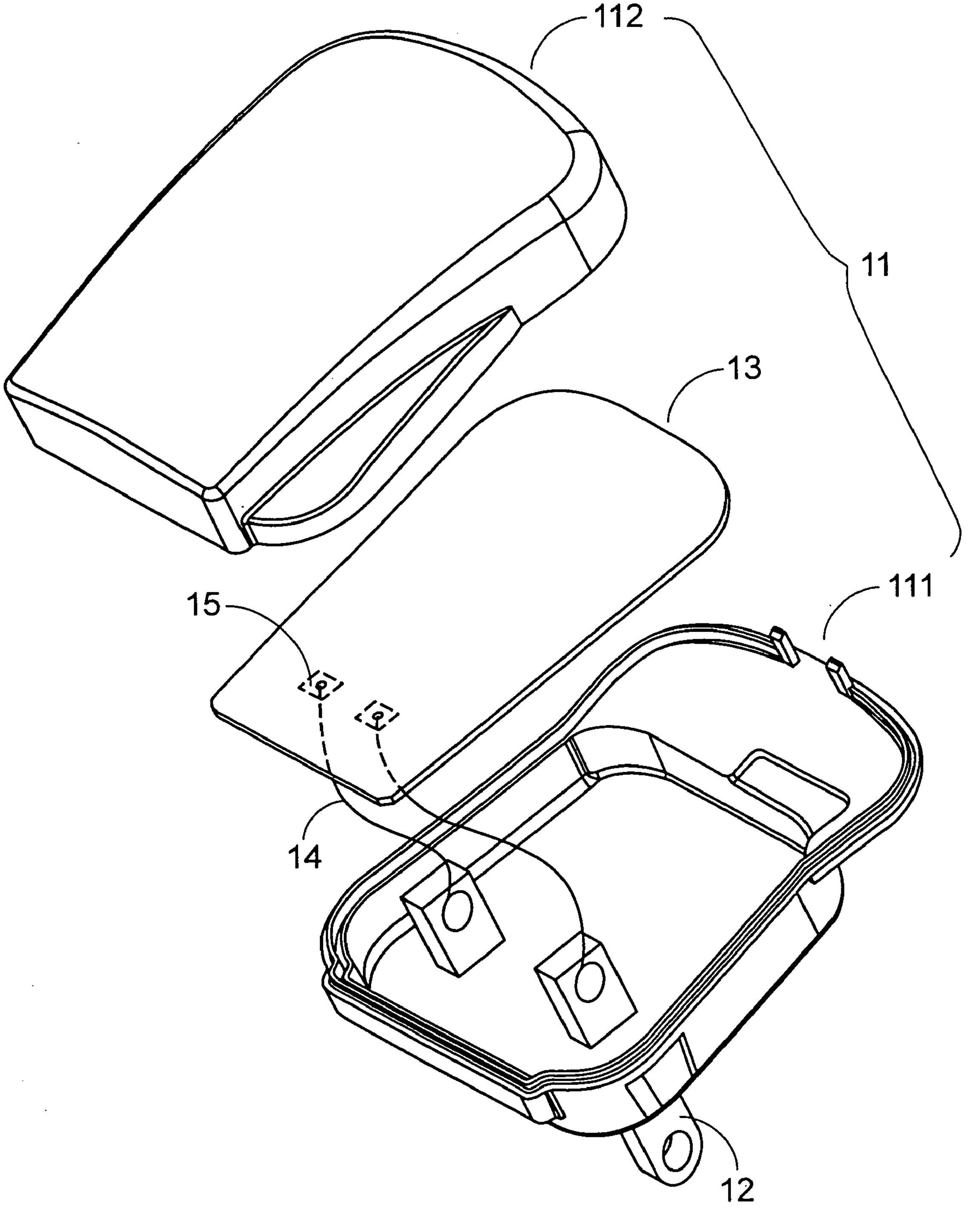
Fig. 1 (Prior Art)
FIG. 1 is a schematic view showing the assembling structure of a conventional electronic apparatus.
Figure 2:
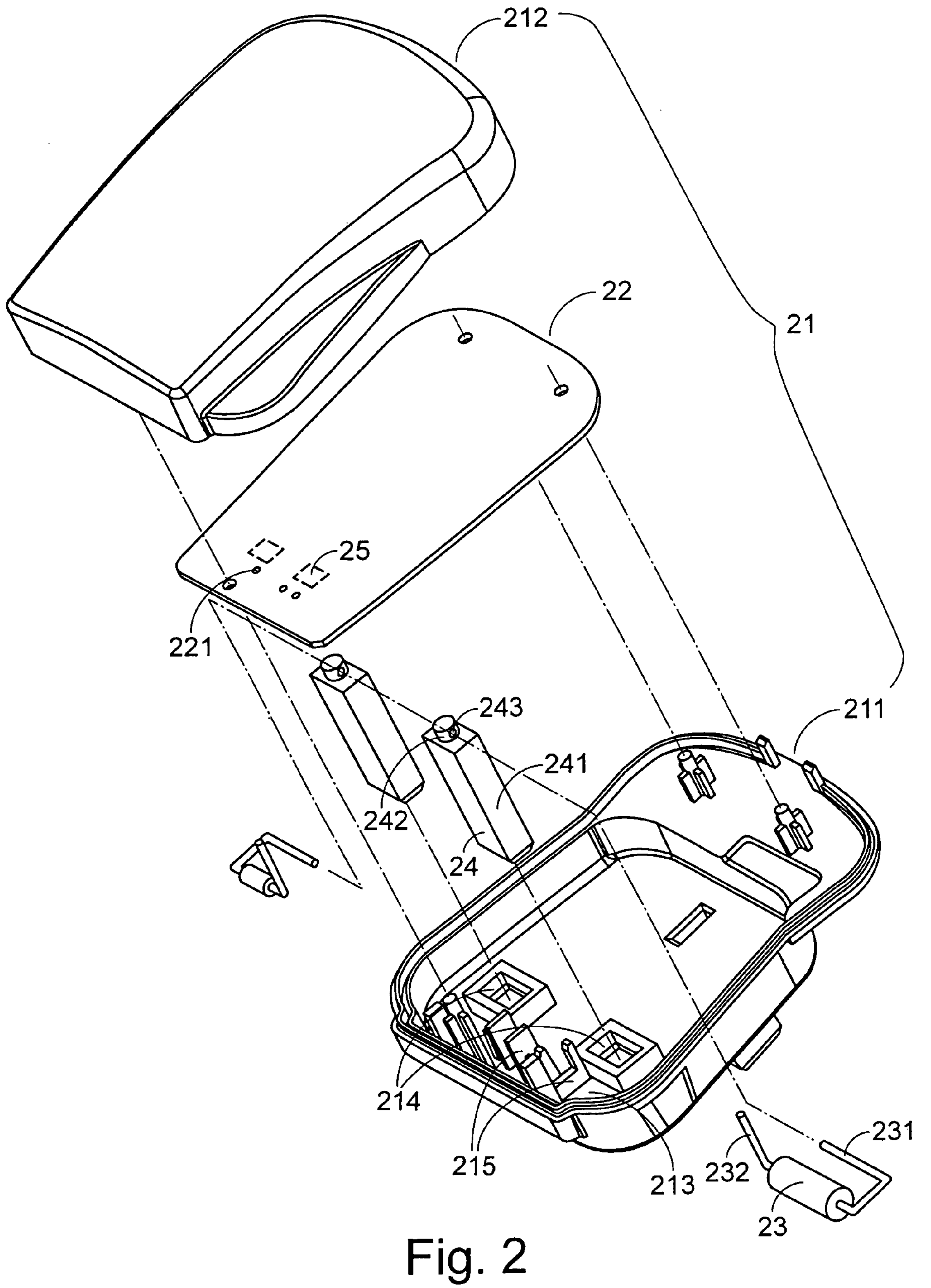
FIG. 2 is a schematic view showing an assembling structure of an electronic apparatus according to the preferred embodiment of the present invention.
Figure 3A:
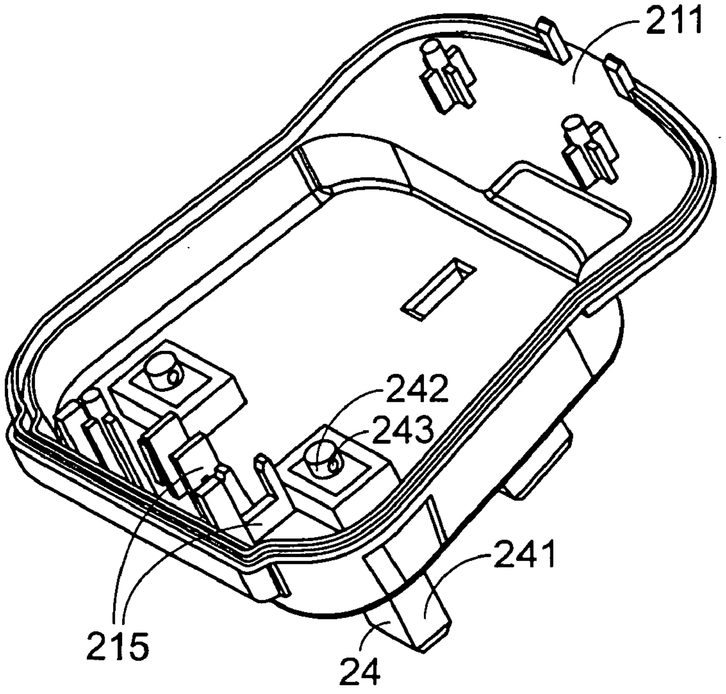
FIGS. 3(*a*)–(*d*) are schematic views showing the assembling processes of the electronic apparatus shown in FIG. 2
Figure 3B:
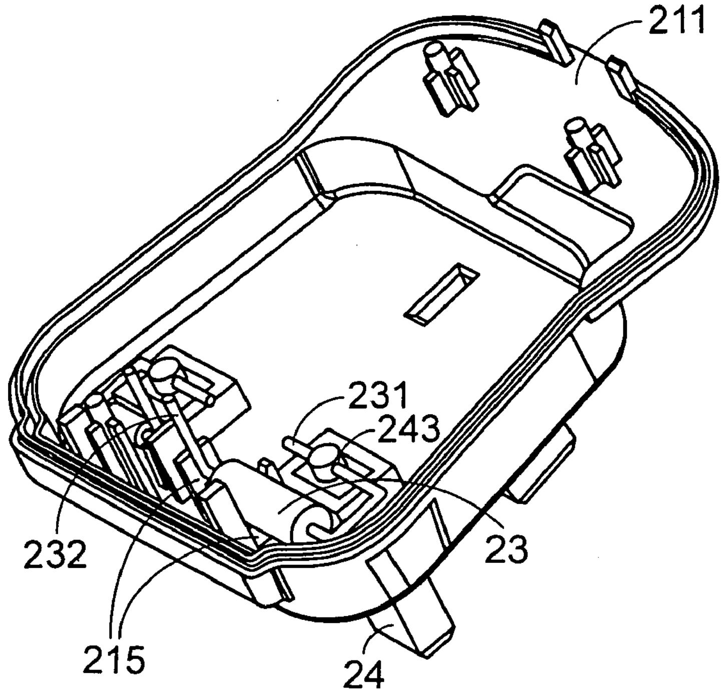
Figure 3C:
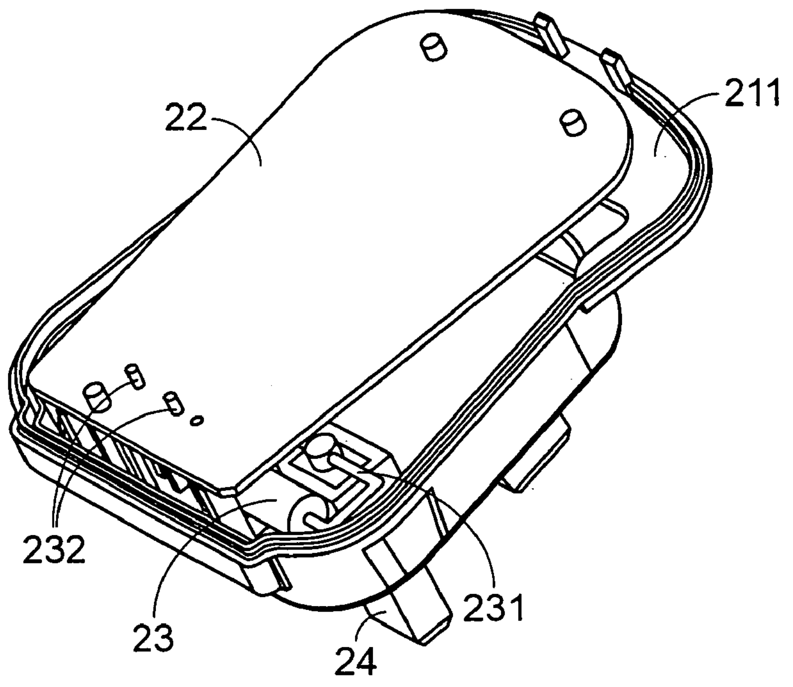
Figure 3D:
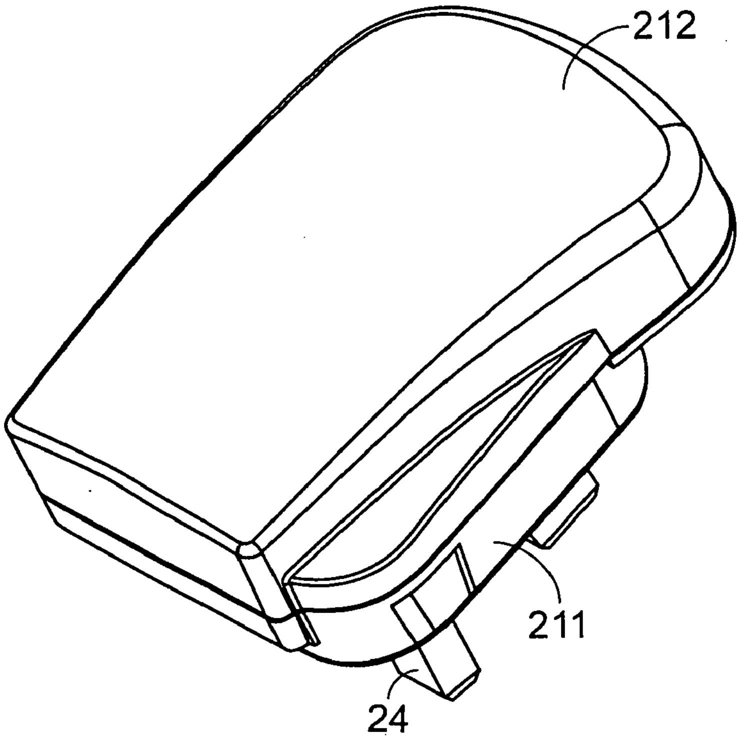

Please refer to FIG. 2, which is a schematic view showing an assembling structure of an electronic apparatus according to the preferred embodiment of the present invention. As shown in FIG. 2, the assembling structure of the electronic apparatus in the present invention mainly comprises a casing 21, a printed circuit board 22, one or more electronic elements 23, and a plurality of conductive terminals 24. The casing 21 comprises a first isolation casing 211 and a second isolation casing 212. The printed circuit board 22 is disposed in a receiving space 213 of the casing 21 and provides different power conversion functions via different circuit layouts and different dispositions of the electronic elements. The plurality of conductive terminals 24 are disposed on the first isolation casing 211 and electrically connected with the printed circuit board 22 for conducting the external power into the printed circuit board so as to enable the electronic apparatus to perform its functions.

On one hand, the conductive terminals 24 can be fixed on the first isolation casing 211 by an insert molding method; on the other hand, they can be also fixed on the first isolation casing 211 through openings 214 of the first isolation casing 211. A first part 241 of the conductive terminal 24 extends to the outer side of the first isolation casing 211 to receive the external power, and a second part 242 of the conductive terminal 24 extends to the inner side of the first isolation casing 211 to contact a conductive pad 25 of the printed circuit board 22. A through hole 243 is formed near the top surface of the second part 242 of the conductive terminal 24.

A plurality of support elements 215 are disposed near the conductive terminals 24 and in the inner side of the first isolation casing 211. One or more electronic elements 23 are supported by the support elements 215 in the inner side of the first isolation casing 211. The electronic element 23 possesses a first linking bar 231 and a second linking bar 232 respectively on the two sides thereof. The first linking bar 231 passes through the through hole 243 of the conductive terminal 24 so that the conductive terminal 24 can be fixed on the first isolation casing 211, and/or the electronic element 23 can be positioned inside the first isolation casing 211. The second linking bar 232 of the electronic element 23 extends vertically and upwardly, and contacts a corresponding conductive element 221 of the printed circuit board 22. In this embodiment, the conductive element 221 is preferably a via hole. The via hole enables a part of the second linking bar 232 to extend out of the printed circuit board 22, so that the second linking bar 232 can be fixed on the printed circuit board 22 by a solder paste to achieve the electrical connection and fixing of the electronic element 23.

The printed circuit board 22 is disposed in the receiving space 213 of the casing 21, so that the second part 242 of the conductive terminal 24 can contact the conductive pad 25 of the printed circuit board 22, and thus, the external power can be conducted to the printed circuit board 22 through the conductive terminal 24 to enable the electronic apparatus to perform its functions.

Please refer to FIGS. 3(*a*)–(*d*), which are schematic views showing the assembling processes of the electronic apparatus shown in FIG. 2. First, as shown in FIG. 3(*a*), a first isolation casing 211 is provided. The first isolation casing 211 comprises a plurality of conductive terminals 24 disposed thereon, wherein the first part 241 of each conductive terminal 24 extends to the outer side of the first isolation casing 211, and the second part 242 of each conductive terminal 24 extends to the inner side of the first isolation casing 211 and comprises a through hole 243. Next, as shown in FIG. 3(*b*), one or more electronic elements 23 are provided, wherein the electronic element 23 possesses a first linking bar 231 and a second linking bar 232. The first linking bar 231 of the electronic element 23 passes through the through hole 243 of the conductive terminal 24. The electronic element 23 is supported and positioned by the support element 215 inside the first isolation casing 211. After that, as shown in FIG. 3(*c*), a printed circuit board 22 is provided, wherein the printed circuit board 22 possesses one or more via holes and a plurality of conductive pads (please refer to FIG. 2 in the mean time). Subsequently, the printed circuit board 22 is disposed on the first isolation casing 211; the second linking bar 232 of the electronic element 23 inserts into a corresponding via hole, and a part of the second linking bar 232 extends out of the printed circuit board 22. Then the second linking bar 232 is fixed by a solder paste, so that the electronic element 23 can be conducted with and fixed to the printed circuit board 22. Finally, as shown in FIG. 3(*d*), a second isolation casing 212 is provided, and the first isolation casing 211 and the second isolation casing 212 are jointed together by an ultrasonic welding process to complete the assembling of the electronic apparatus.

Certainly, the electronic apparatus of the present invention can be an adaptor, and the electronic element 23 can be a resistor, a capacitor, or a diode. Besides, the number of the conductive terminal is not confined to two, and the bending angle and manner of the first linking bar 231 and the second linking bar 232 of the electronic element 23 are also not confined to the above-mentioned embodiments.

According to the above-mentioned descriptions, the electronic apparatus of the present invention uses the electronic element to electrically connect the conductive terminal and the printed circuit board, wherein the first linking bar of the electronic element passes through the through hole of the conductive terminal, and the second linking bar of the electronic element inserts into the via hole of the printed circuit board to achieve the fixing and conduction between the conductive terminal and the printed circuit board. The assembling structure of the electronic apparatus in the present invention can not only reduce the number of the electronic elements disposed on the printed circuit board when using the surface mount technology, but also increase the available wiring space of the printed circuit board to lower the density and complexity of wiring, and thus the purposes of miniaturizing the electronic apparatus and improving the electromagnetic compatibility (EMC) can be achieved. Moreover, the assembling method of the electronic apparatus in the present invention is simpler than the conventional method. Therefore, the present invention possesses a high industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An assembling structure of an electronic apparatus, comprising:

a casing having a receiving space;

a plurality of conductive terminals disposed on said casing, each conductive terminal having a first part extending to the outer side of said casing and a second part extending to the inner side of said casing, wherein said second part has a through hole;

a printed circuit board disposed in said receiving space and having at least a conductive element and a plurality of conductive pads, wherein said plurality of conductive pads contact said second parts of said plurality of conductive terminals; and at least an electronic element having a first linking bar and a second linking bar, wherein said first linking bar passes through said through hole, and said second linking bar connects with said conductive element of said printed circuit board.

2. The assembling structure of the electronic apparatus of claim 1, wherein said electronic element is a resistor, a capacitor, or a diode.

3. The assembling structure of the electronic apparatus of claim 1, wherein said casing comprises a first isolation casing and a second isolation casing.

4. The assembling structure of the electronic apparatus of claim 3, wherein said first isolation casing and said second isolation casing are assembled by an ultrasonic welding process.

5. The assembling structure of the electronic apparatus of claim 3, wherein said first isolation casing further comprises a plurality of support elements in the inner side thereof to support and position said electronic element.

6. The assembling structure of the electronic apparatus of claim 3, wherein said first isolation casing has a plurality of openings for disposing said plurality of conductive terminals.

7. The assembling structure of the electronic apparatus of claim 1, wherein said conductive element is a via hole.

8. The assembling structure of the electronic apparatus of claim 7, wherein said second linking bar inserts into said via hole of said printed circuit board, and a part of said second linking bar extends out of said printed circuit board.

9. The assembling structure of the electronic apparatus of claim 8, wherein said second linking bar is fixed on said printed circuit board by a solder paste.

10. The assembling structure of the electronic apparatus of claim 1, wherein said electronic apparatus is an adaptor.

11. An assembling method of an electronic apparatus, comprising steps of:

providing a first isolation casing having a plurality of conductive terminals disposed thereon, each conductive terminal having a first part extending to the outer side of said casing and a second part extending to the inner side of said casing, wherein said second part has a through hole;

providing at least an electronic element having a first linking bar and a second linking bar;

passing said first linking bar of said electronic element through said through hole;

providing a printed circuit board having at least a via hole and a plurality of conductive pads;

disposing said printed circuit board in said first isolation casing and inserting said second linking bar of said electronic elements into said via hole;

fixing said second linking bar to said printed circuit board; and providing a second isolation casing and assembling said first isolation casing and said second isolation casing.

12. The assembling method of the electronic apparatus of claim 11, wherein said electronic element is a resistor, a capacitor, or a diode.

13. The assembling method of the electronic apparatus of claim 11, wherein said first isolation casing and said second isolation casing are assembled by an ultrasonic welding process.

14. The assembling method of the electronic apparatus of claim 11, wherein a part of said second linking bar extends out of said printed circuit board.

15. The assembling method of the electronic apparatus of claim 11, wherein said second linking bar is fixed on said printed circuit board by a solder paste.

16. The assembling method of the electronic apparatus of claim 11, wherein said electronic apparatus is an adaptor.

* * * * *